United States Patent [19]
Myers et al.

[11] 4,273,399
[45] Jun. 16, 1981

[54] TRANSDUCER SUPPORTING AND CONTACTING MEANS

[75] Inventors: Ronald W. Myers, Landisburg; Daniel V. Nardone, Camp Hill, both of Pa.

[73] Assignee: AMP Incorporated, Harrisburg, Pa.

[21] Appl. No.: 91,672

[22] Filed: Nov. 5, 1979

[51] Int. Cl.³ .................................................. H01R 9/09
[52] U.S. Cl. ................................ 339/17 C; 339/17 M; 339/256 R; 339/258 R
[58] Field of Search ............. 339/17 R, 17 C, 17 CF, 339/17 N, 17 M, 256 R, 258 R; 248/603, 604, 316 D; 310/355, 356

[56] References Cited

U.S. PATENT DOCUMENTS

| | | | |
|---|---|---|---|
| 2,329,497 | 9/1943 | Washburn | 310/356 |
| 3,202,291 | 8/1965 | Root | 248/316 D |
| 3,331,970 | 7/1967 | Dundon et al. | 310/9.1 |
| 3,479,634 | 11/1969 | Pritulsky | 339/17 R |
| 3,578,995 | 5/1971 | Massa | 310/8.8 |
| 3,849,679 | 11/1974 | Massa | 310/8.2 |
| 3,879,726 | 4/1975 | Sweany | 340/384 E |
| 3,907,394 | 9/1975 | Barnes | 339/17 CF |
| 3,937,991 | 2/1976 | Massa et al. | 310/9.1 |
| 4,122,365 | 10/1978 | Stephens | 310/324 |

FOREIGN PATENT DOCUMENTS 2840162  3/1979  Fed. Rep. of Germany ........... 310/356

OTHER PUBLICATIONS

Molex Technical Bulletin, pp. A-3 thru A-6.

*Primary Examiner*—John McQuade
*Attorney, Agent, or Firm*—Frederick W. Raring

[57] ABSTRACT

Supporting and contacting means for supporting a disk-like piezoelectric tone transducer on a circuit board comprises a pair of sheet metal supporting members which are mounted on the circuit board in spaced-apart planes which extend normally of the plane of the circuit board. The supporting members are connected by solder tabs to conductors on the circuit board and have opposed re-entrant notches on their upper edges. The transducer is mounted in the supporting members by positioning its circular edge in two corresponding notches, flexing the supporting members and then locating the edge in the remaining notches of the supporting members so that the transducer is engaged at four locations on its periphery. Electrical contact is maintained with the ceramic material of the transducer by means of a spring contact arm mounted on the circuit board between the supporting members.

17 Claims, 8 Drawing Figures

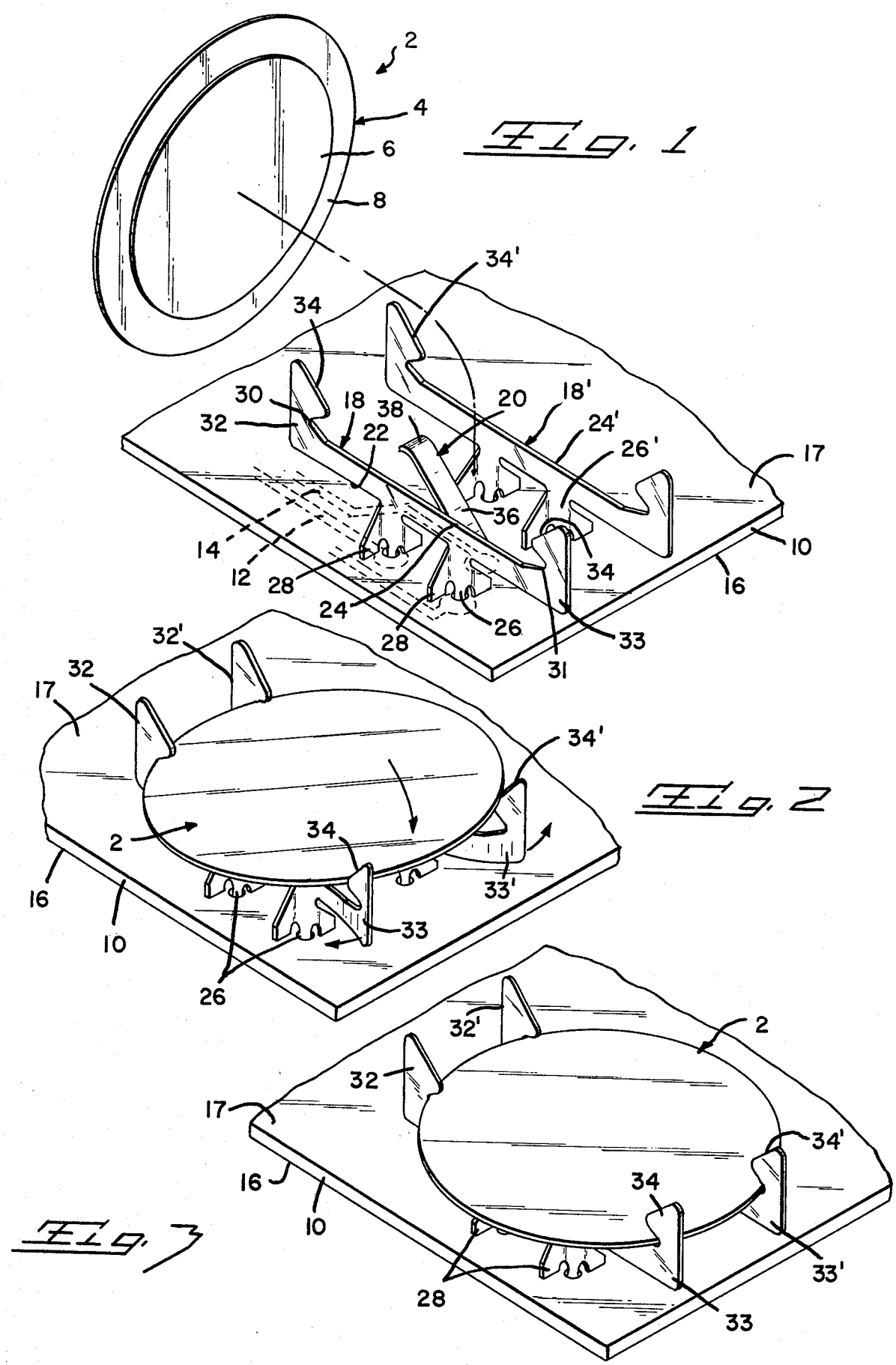

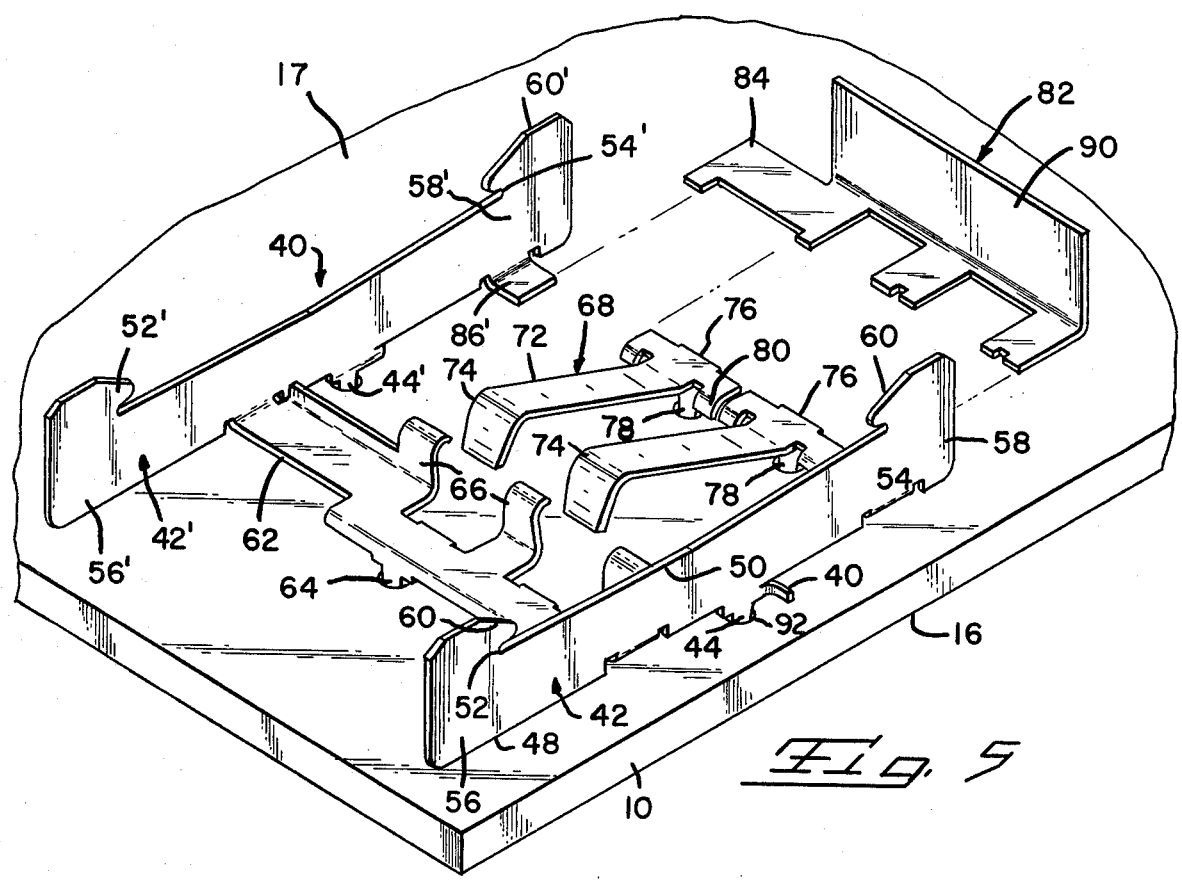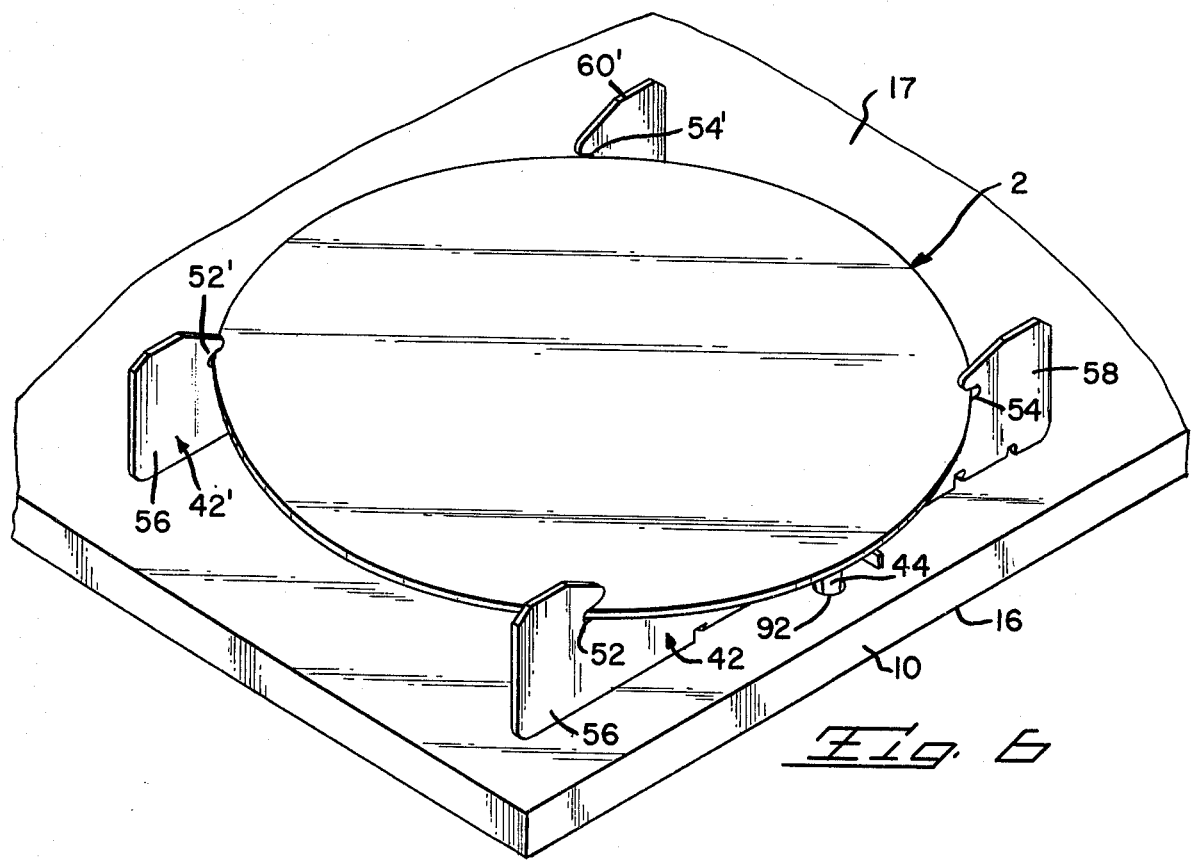

TRANSDUCER SUPPORTING AND CONTACTING MEANS

SUMMARY OF THE INVENTION

This invention relates to the devices for supporting and establishing electrical contact with disk-like piezoelectric tone transducers of the type commonly mounted on circuit boards.

BACKGROUND OF THE INVENTION

Widespread use is being made of disk-like piezoelectric tone transducers in devices which produce an audible tone in response to an electrical signal. Such devices are used, for example, in automotive warning circuits, in smoke detectors, and in instruction devices, and are usually mounted on the circuit board on which the control circuitry for the device is mounted. Mounting means for transducers of this type commonly comprise a plastic housing which supports the transducer and which contains electrical contacting devices which electrically contact the transducer at a location adjacent to its periphery and on the ceramic piezoelectric material which is located inwardly from the periphery of the transducer. The present invention is directed to the achievement of a supporting and contacting device for a transducer which does not require insulating housing and which can be easily assembled to the circuit board on which the transducer is to be mounted.

In accordance with the principles of the invention, a pair of spaced-apart sheet metal transducer supporting members are mounted on the circuit board for supporting the transducer around its periphery and a spring contact member is mounted on the circuit board between the supporting members for contacting the ceramic piezoelectric material which is centrally supported on the transducer. The supporting members are disposed in planes which extend normally of the circuit board on which they are mounted and each supporting member has opposed re-entrant notches adjacent to its ends so that the disk-like transducer can be positioned on the two supporting members with its edge received in the four notches of the two supporting members. The engagement of the edges of the transducer with the notches in the supporting member provides the electrical contact required with the periphery of the transducer and the spring contact member is resiliently biased against the piezoelectric material of the transducer when it is mounted in the supporting members.

Supporting and contacting members, in accordance with the invention, can be produced in the form of a one-piece device of stamped and formed sheet metal which can be assembled to the circuit board by simply positioning it on the board with solder tabs, which are integral with the device, extending through holes in the circuit board. The solder tabs are soldered to conductors on the circuit board to establish electrical connections required for the driving circuit. Alternatively, the supporting members and the contact member can be produced as loose piece items and can be separately assembled to the circuit board.

DESCRIPTION OF THE DRAWINGS

FIG. 1 is a perspective view showing a portion of a circuit board having a supporting and contacting means in accordance with the invention mounted thereon and showing a disk-like piezoelectric transducer exploded from the supporting and contacting means.

FIGS. 2 and 3 are views similar to FIG. 1, illustrating the assembly of the transducer to the supporting means and showing the transducer in assembled relationship to the supporting means.

FIG. 5 is a view similar to FIG. 4 showing the supporting and contacting means mounted on the circuit board and illustrating removal of a removable connecting section of the device.

FIG. 6 is a view similar to FIG. 5 showing a transducer mounted on the supporting and contacting device.

Figure 4:
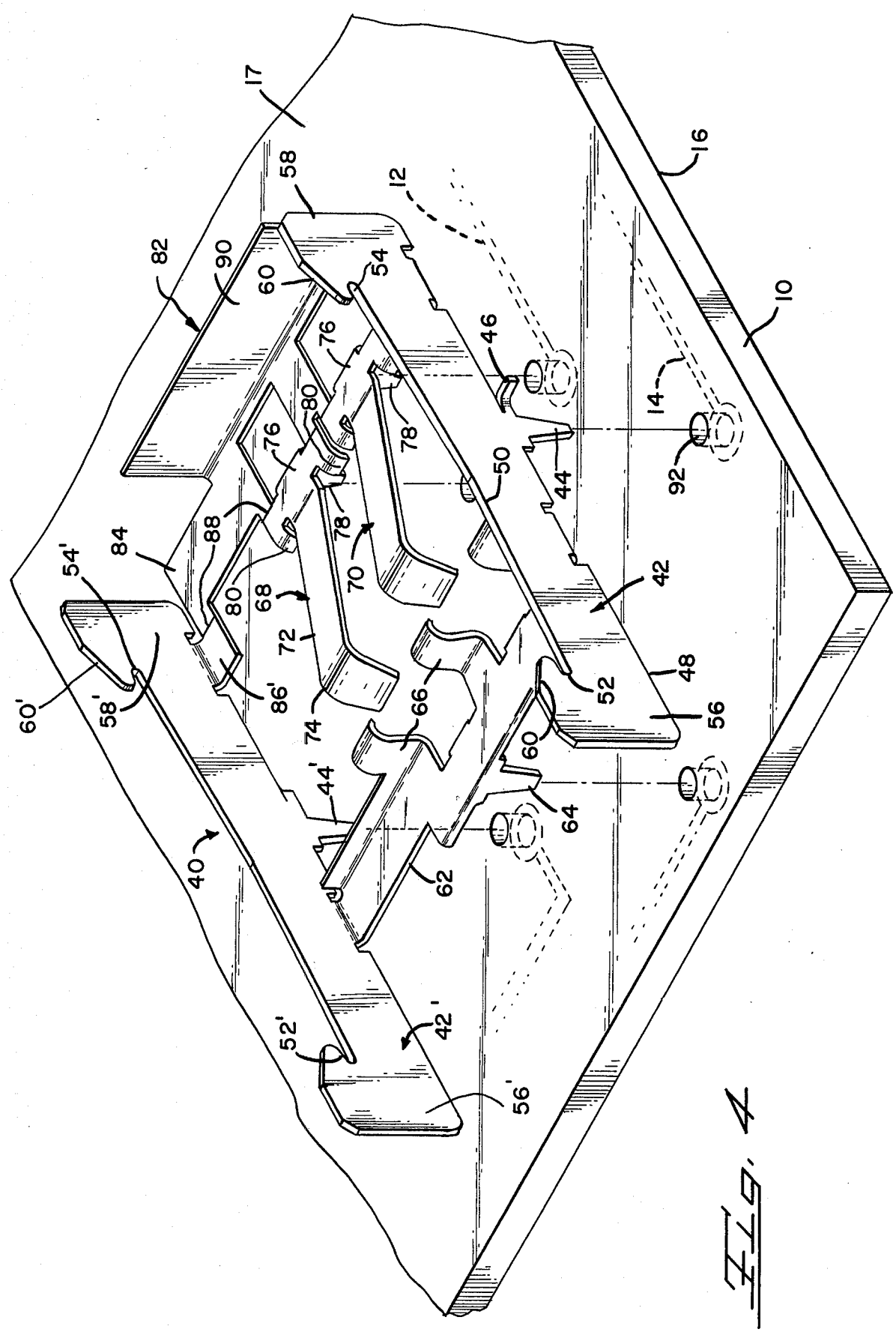
FIG. 4 is a perspective view showing a one-piece supporting and contacting means, in accordance with the invention, exploded from a circuit board preparatory to assembly of the device to the circuit board.
Figure 7:
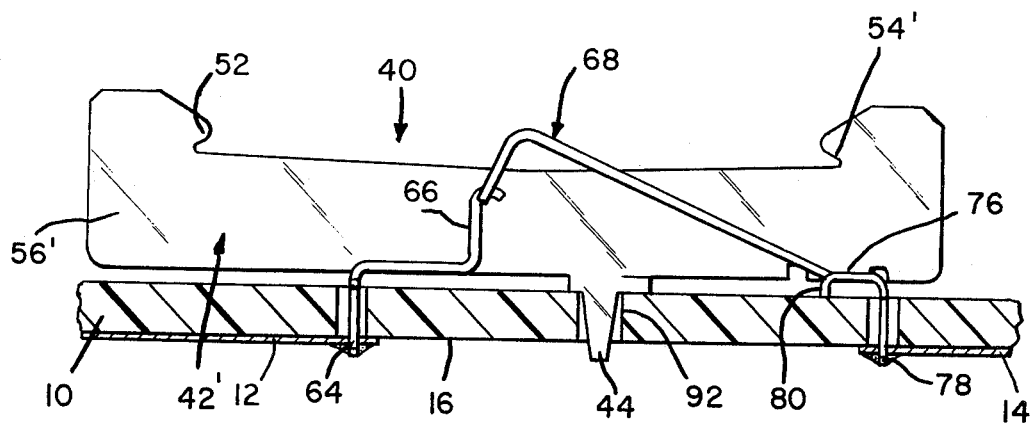
FIG. 7 is a cross-sectional view taken along the lines 7—7 of FIG. 5.

Referring first to FIGS. 1-3, a typical piezoelectric tone transducer 2 comprises a relatively thin metallic disk 4 of thin sheet metal having a body of ceramic piezoelectric material 6 on one surface thereof. The piezoelectric material is spaced from the circular edge of the disk 4 so that a peripheral zone 8 remains, to which contact is made when the device is driven. Contact is also made with the piezoelectric material 6 to cause the transducer to produce an audible tone. In common usage, the transducer 2 is mounted above the upper surface 17 of a circuit board 10 and conductors 12, 14 are provided on the underside 16 of the circuit board. The conductors 14 are electrically connected to the exposed peripheral metallic surface 8 and the conductors 12 are connected to the piezoelectric material 6.

The embodiment of the invention shown in FIGS. 1-3 comprises a pair of sheet metal support members 18, 18' which are identical to each other and which will, therefore, be described with the same reference numerals, differentiated by prime marks.

The support member 18 has a first edge 22 which is adjacent to, but spaced from, the upper surface 17 of the circuit board and a second edge 24 which is remote from the circuit board. The support members are mounted in the circuit board in planes which extend normally of the surface 17 by means of solder tabs 26 which extend from the lower edge 22 through suitable holes in the circuit board so that they can be connected to terminal pads on the ends of the conductors 14. Advantageously, the solder tabs 26 have laterally extending ears 28 to assist in stabilizing the support members.

Each support member has opposed re-entrant notches 30, 31 adjacent to its ends 32, 33 which are dimensioned to receive edge portions of the transducer. The root portions of the notches should therefore be less than the thickness of the metallic disk 4 of the transducer. The portions 34 of the second edge 24 which are adjacent to the ends 32, 33 are inclined away from the notches, that is, upwardly and away from the surface of the circuit board, as viewed in FIG. 1. As will be explained below, the inclination of these portions 34 of the edges 24, 24' facilitate assembly of the transducer to the supporting members. It should also be mentioned at this point that the section of each support member which extends from the solder tabs 26 to the ends 32, 33 is, in effect, a cantilever beam which can be flexed normally of its own plane and parallel to the plane of the circuit board. The support members should be of a material capable of undergoing some flexure of this type without overstressing.

Electrical contact is established with the ceramic piezoelectric material 6 by means of a sheet metal contact member 20 having a mounting portion (not shown) which is mounted on the circuit board between the support members 18, 18'. Contact member 20 has a spring arm 36 which extends obliquely upwardly from the mounting portion and the free end of this spring arm has a contact portion 38 for engagement with the ceramic material 6. This contact portion is above the plane defined by the edges 24 of the support members so that the contact portion 38 will be resiliently biased against the ceramic material when the transducer 2 is mounted in the support members.

The transducer is assembled to the support members, as shown in FIG. 2, by locating edge portions of the transducer in the notches 30, 30' and then moving the transducer downwardly with accompanying flexure of the end portions of the support members at the ends 33, 33' away from each other. Flexing of these ends of the support members away from each other is facilitated by the inclined surfaces 34, 34' which are adjacent to the notches 31, 31'. As the transducer moves over these edges, and is pressed downwardly, a force component is produced which urges the end portions of the support members away from each other until the transducer is received in the notches 31, 31'. After the transducer is received in the notches, the support members return to their normal position, as shown in FIG. 3, and the transducer is supported above the surface of the circuit board at four locations spaced around its periphery.

It will be apparent from an inspection of FIGS. 1–3 that a pair of support members 18 of given dimensions, and particularly of given distance between the opposed notches 30, 31, can be used with transducers of widely varying diameters by merely locating the support members on the circuit board such that the distance between diametrically matching notches 30, 31' and 30', 31 is equal to the diameter of the transducer 2. Practice of the invention, in accordance with the embodiment, therefore avoids the necessity of designing a separate and different supporting means for transducers of different dimensions.

It is preferable to mount the supporting members 18, 18' in aligned relationship, as shown in FIGS. 1–3, so that the transducer is engaged at symmetrically spaced locations around its periphery. However, it is also entirely feasible to mount the supporting members 18, 18' in planes which extend normally of the circuit board and which extend obliquely of, and which intersect, each other. Under such circumstances, the transducer would be supported at four locations with the angular interval between two of the supporting locations being relatively short, and the angular interval between two of the supporting locations being relatively long. This mounting arrangement might be required under circumstances where clearance must be provided for other components mounted on the circuit board and it is impractical to place the supporting members in parallel aligned relationship.

The supporting members 18 are extremely durable and are resistant to damage during assembly to the circuit board and during subsequent handling and assembly of the transducer to the support members. These support members are flexed in directions extending normally of their own planes when the transducer is assembled to them, as shown in FIG. 2, and it is merely necessary to select a conductive sheet metal material of good spring characteristics to ensure that they will not be damaged during this assembly operation.

FIGS. 4–7 show a one-piece supporting and contacting device 40 in accordance with the invention having spaced-apart support members 42, 42' which, as with the previous embodiment, have first and second edges 48, 50 which are proximate to, and remote from, the surface 17 of the circuit board 10 when the device is mounted on the circuit board. A single solder tab 44, extends downwardly from the lower, or first, edge 48 of each support member midway between the ends 56, 58 and an ear 46 is provided adjacent to the tab 44 for stabilizing purposes. The opposed re-entrant notches 52, 54, as described above, are formed adjacent to the ends 56, 58 and inclined surfaces 60 extend from these notches towards the ends 56, 58.

The two support members 42, 42' are joined to each other by a tie bar 62 which is integral at its ends with the support members at the first edges 48, 48'. A solder tab 64 is provided on this tie bar for soldering to a metallized surface on the underside 16 of the circuit board and spaced-apart guard fingers 66 extend from the tie bar in spaced relationship to a pair of contacting means 68, 70. Each of the two contacting means has a spring arm 72 having a contact portion 74 on its free end and a mounting portion 76 from which a solder tab 78 extends. Additionally, stabilizing ears 80 extend from the mounting ears on each side of the spring arms to stabilize the mounting portions on the circuit board.

The contacting means 68, 70 are maintained as part of the one-piece stamped supporting and contacting device 40 prior to assembly of the contacting and supporting device to the circuit board by means of a removable connection section 82. This connecting section comprises a flat removable tie bar 84 which is integral at its ends with inwardly directed ears, as shown at 86', which extend from the supporting members adjacent to the ends 58, 58'. The connecting section 82 is scored, or otherwise weakened, as shown at 88, adjacent to the ears 86, 86' and adjacent to the mounting portions 76 of the contacting means 68, 70. This connecting section may also be provided with an upstanding flange 90 which serves to protect the spring arms 72 prior to assembly of the device to the circuit board.

The supporting and contacting device 40 is assembled to the circuit board by simply aligning the solder tabs 44, 44', 64, and the solder tabs 78 with suitable holes, as shown at 92, in the circuit board and moving the device 40 downwardly until the solder tabs extend through these holes. Thereafter, the lower ends of the solder tabs are soldered to the metallized areas on the underside of the circuit board. It is not essential that the conductor 14 be electrically connected to both of the solder tabs 44, 44' and to the solder tabs 64, however, redundant electrical connections may be established if desired.

The removable section 82 is separated from the supporting members 42 and from the contact means 68, 70 by merely bending it upwardly from the plane of the circuit board so that fracture occurs along the score lines 88. Thereafter, the transducer can be assembled to the supporting members, as explained above, by inserting edge portions of the transducer into the notches 52, 52' and moving the transducer downwardly over the inclined edges 60, 60'. It will be apparent that the supporting members are more flexible at their end 58, 58' than at their ends 56, 56' because of the presence of the tie bar 62 adjacent to the ends 56, 56'.

Two contacting means 68, 70 are provided in the embodiment in FIG. 4, for the reason that under some circumstances it is desirable to maximize the audible output of a transducer by providing a feedback circuit which has the effect of causing changes in the driving circuit, which adjust the frequency of oscillation so as to provide a driving frequency which is at, or near, the natural frequency of the transducer. Upon some circumstances, it may be unnecessary to use one of the contacting means 68, 70 where a feedback circuit is not included in the driving circuit.

Figure 8:
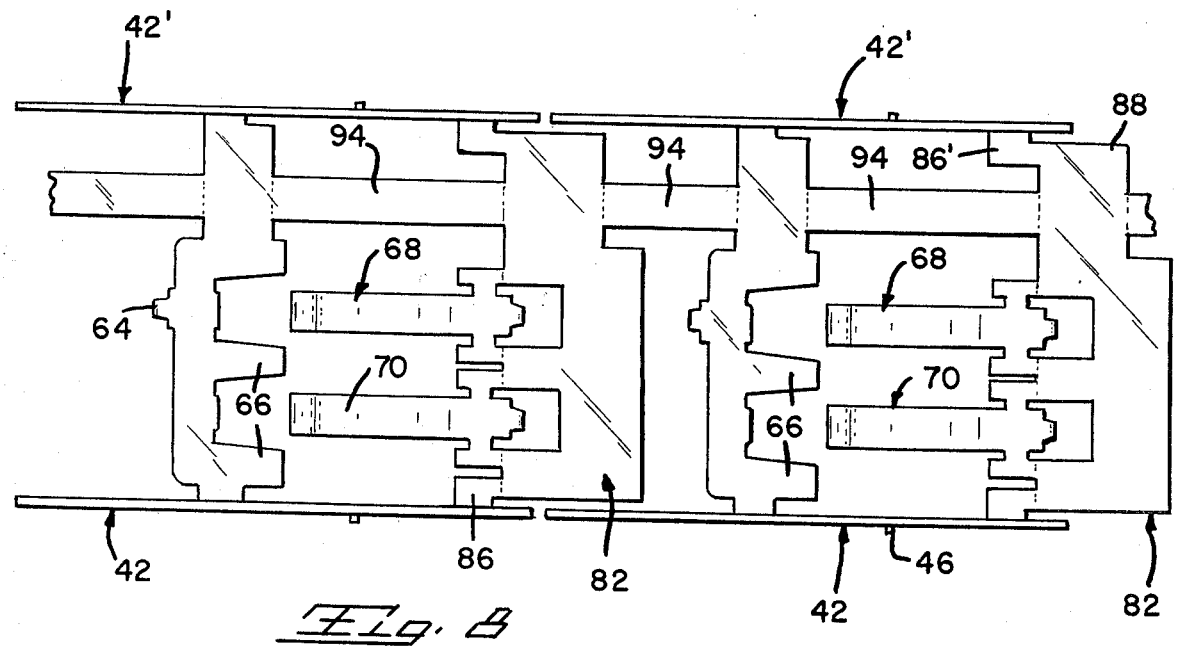
FIG. 8 is a plan view of a portion of a continuous strip of supporting and contacting devices in accordance with the invention.

If desired, the one-piece embodiment of the invention can be produced as a continuous strip, as shown in FIG. 8, with adjacent devices 40 in the strip connected to each other by a continuous carrier strip 94. This carrier strip would be removed at the time of insertion of the devices in the circuit boards by means of an insertion machine having suitable shearing dies for shearing out the carrier strip.

We claim:

1. A circuit board having supporting and contacting means thereon for supporting a circular disk-like piezoelectric tone transducer in spaced parallel relationship to said circuit board and for establishing first electrical contact with the periphery of said transducer and second electrical contact with a central location on said transducer, said supporting and contacting means comprising:

a pair of aligned sheet metal supporting members, said members being disposed in spaced-apart planes which extend normally of the plane of said circuit board, each of said supporting members having a first edge which is proximate to, and spaced from, the surface of said circuit board and a second edge which is remote from said circuit board, each of said members being secured to said circuit board by securing means which is remote from at least one end of said member whereby each of said members has a flexible portion which extends from said securing means to said one end, each of said flexible portions being laterally flexible normally of its own plane and parallel to the plane of said circuit board, each of said members having on said second edge thereof opposed notches adjacent to the ends thereof, said notches being dimensioned to receive peripheral portions of said transducer, said notches constituting said first electrical contact, said second electrical contact comprising a contact member having a mounting portion which is mounted on said circuit board between said supporting members, a spring contact arm extending from said mounting portion away from said circuit board, said contact arm having a contact portion for establishing said second electrical contact whereby, said transducer can be mounted in said supporting and contacting means by flexing said flexible portions of said supporting members away from each other, positioning said transducer in said notches, and permitting said flexible portions to return to their normal positions, and said spring contact arm will be against, and in electrical contact with, said central location on said transducer.

2. A circuit board having supporting and contacting means thereon, as set forth in claim 1, said securing means of each of said supporting members comprising solder tab means extending centrally from said first edge.

3. A circuit board having supporting and contacting means thereon as set forth in claim 2, and tie bar means extending between, and integral at its ends with, said supporting members.

4. A circuit board having supporting and contacting means thereon, as set forth in claim 3, said solder tab means on each of said supporting members comprising a single solder tab, and an additional solder tab extending from said tie bar means.

5. A circuit board having supporting and contacting means thereon, as set forth in either of claims 3 or 4, said tie bar means comprising a flat tie bar which is against said circuit board and which is integral at its ends with said first edges of said supporting members.

6. A circuit board having supporting and contacting means thereon, as set forth in claim 5, said tie bar having guard finger means extending from one edge thereof, said guard finger means being adjacent to, and in protective relationship to, said spring contact arm.

7. A circuit board having supporting and contacting means thereon, as set forth in either of claims 1 or 3, said contact portion of said contact arm being located, relative to said notches, in a position to contact said transducer at the geometric center thereof when said transducer is assembled to said supporting members, and an additional contact member on said circuit board, said additional contact member having a contact portion located in a position to contact said transducer at a location spaced from said geometric center.

8. A circuit board having supporting and contacting means thereon, as set forth in claim 1, said notches of said supporting members being re-entrant towards said ends of said supporting members, end portions of said second edge of each of said members which are between said notches and said ends of said member being inclined away from said notches whereby said end portions of said second edges function as camming means to flex said flexible portions of said members away from each other when said transducer is assembled to said members.

9. Stamped and formed sheet metal supporting and contacting means which is intended for mounting on a circuit board for supporting and establishing first and second electrical contact with a disk-like piezoelectric tone transducer, said first contact being with said transducer at the periphery thereof and said second contact being at a central location on said transducer, said supporting and contacting means comprising:

a pair of elongated blade-like supporting members, each of said members having first and second edges extending between the ends thereof, at least one solder tab extending from said first edge of each of said supporting members, said solder tab being spaced from one end of its respective supporting member whereby upon mounting said members in said circuit board, each of said members will have a flexible portion extending from said solder tab to said one end, each of said members having on said second edge opposed notches adjacent to said ends of said members, said notches being dimensioned to receive peripheral portions of said transducer, and a second electrical contact member having a mounting portion and a spring contact arm extending from said mounting portion, said mounting portion having a solder tab extending therefrom, said spring contact arm having a contact portion for engagement with said transducer whereby, upon mounting said supporting members on said circuit board in spaced-apart relationship, by insertion of said solder tabs through holes in said circuit board, and upon mounting said second electrical contact member between said supporting members, said transducer can be mounted in said supporting and contacting means by flexing said flexible portions of said supporting members away from each other, positioning said transducer in said notches, and permitting said flexible portions to return to their normal positions, and said first electrical contact will be established by said notches and said second electrical contact will be established by said contact portion of said spring arm.

10. Stamped and formed sheet metal supporting and contacting means as set forth in claim 9, said notches of said supporting members being re-entrant towards said ends of said supporting members, end portions of said second edge of each of said members which are between said notches and said ends of said member being inclined away from said notches whereby said end portions of said second edges function as camming means to flex said flexible portions of said members away from each other when said transducer is assembled to said members.

11. Stamped and formed sheet metal supporting and contacting means as set forth in claim 9, having integral tie bar means extending between, and integral at its ends with, said supporting members.

12. Stamped and formed sheet metal supporting and contacting means as set forth in claim 11, said second electrical contact member being between said supporting members, and removable connecting means connecting said contact member to at least one of said supporting members, said connecting means being removable from said supporting members and said contact member after assembly of said supporting members and said contact member to said circuit board.

13. A one-piece sheet metal stamped and formed supporting and contacting device intended for mounting on a circuit board for supporting and establishing electrical contact with, a circular piezoelectric audio tone transducer, said supporting and contacting device comprising:

a pair of elongated supporting members disposed in aligned relationship in parallel spaced-apart planes, tie bar means extending between said supporting members, each of said supporting members having a first edge which is proximate to said circuit board when said device is mounted thereon and a second edge which is remote from said circuit board, securing means extending from said first edge of each of said supporting members for securing said members to said circuit board, each of said securing means being remote from at least one end of its respective member whereby each of said members has a flexible portion which extends from said securing means to said one end when said members are mounted on said circuit board, each of said members having a notch adjacent to each end thereof on said second edge thereof, diametrically opposite notches on said members being spaced apart by a distance substantially equal to the diameter of said transducer, a contacting spring means between said members, said contacting spring means having a mounting portion and a spring arm, said mounting portion being in a plane defined by said first edges, said spring arm extending obliquely towards, and past, the plane defined by said second edges, and removable connecting means connecting said mounting portion to one of said supporting members whereby, upon mounting said device on said circuit board, said first edges of said members will be proximate to said circuit board and said second edges will be remote from said circuit board, and said supporting members will be in parallel planes which extend normally of said circuit board, and upon removal of said removable connecting means, said transducer can be mounted in said supporting members by flexing said flexible portions of said members away from each other, positioning said transducer in said notches, and permitting said flexible portions to return to their normal positions, and said spring arm will be against, and in electrical contact with a central location of said transducer, and electrical contact will be established with peripheral portions of said transducer by said notches.

14. A supporting and contacting device as set forth in claim 13, said securing means on each of said members comprising a solder tab.

15. A supporting and contacting device as set forth in claim 13, said contacting spring means comprising a pair of side-by-side mounting portions, each of said mounting portions having a spring arm extending therefrom.

16. A supporting and contacting device as set forth in claim 13, said tie bar means comprising a flat tie bar which is integral at its ends with said first edges of said supporting members, said tie bar having at least one guard finger extending from one side edge thereof, said guard finger being adjacent to, and in protective relationship to, said spring arm.

17. A supporting and contacting device as set forth in claim 13, said notches of said supporting members being re-entrant towards said ends of said supporting members, end portions of said second edge of each of said members which are between said notches and said ends of said member being inclined away from said notches whereby said end portions of said second edges function as camming means to flex said flexible portions of said members away from each other when said transducer is assembled to said members.

* * * * *